US011206499B2

(12) United States Patent
Shenoy et al.

(10) Patent No.: US 11,206,499 B2
(45) Date of Patent: Dec. 21, 2021

(54) HEARABLE DEVICE COMPRISING INTEGRATED DEVICE AND WIRELESS FUNCTIONALITY

(71) Applicant: QUALCOMM Incorporated, San Diego, CA (US)

(72) Inventors: Ravindra Shenoy, Dublin, CA (US); Rohit Sauhta, San Diego, CA (US); Elbert McLaren, San Diego, CA (US); Sidney Sitachitt, Carlsbad, CA (US); Donald William Kidwell, Jr., Los Gatos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 96 days.

(21) Appl. No.: 15/677,427

(22) Filed: Aug. 15, 2017

(65) Prior Publication Data

US 2018/0054682 A1 Feb. 22, 2018

Related U.S. Application Data

(60) Provisional application No. 62/376,738, filed on Aug. 18, 2016.

(51) Int. Cl.
*H04R 25/00* (2006.01)
*H04R 1/10* (2006.01)
(Continued)

(52) U.S. Cl.
CPC ......... *H04R 25/554* (2013.01); *H04R 1/1016* (2013.01); *H04R 1/1025* (2013.01);
(Continued)

(58) Field of Classification Search
CPC .. H04R 25/554; H04R 25/658; H04R 1/1016; H04R 1/1015; H04R 2225/023;
(Continued)

(56) References Cited

U.S. PATENT DOCUMENTS 5,402,494 A * 3/1995 Flippe ................. H04R 25/505
381/314
5,789,815 A * 8/1998 Tessier ................ H01L 23/3121
257/668
(Continued)

FOREIGN PATENT DOCUMENTS

CN 202799146 U 3/2013
CN 101971646 B 7/2013
(Continued)

OTHER PUBLICATIONS

Alvarado, Integrated Circuit Image Gallery PowerPC 602 Microprocessor, Nov. 13, 2015, p. 2. (Year: 2015).*
(Continued)

*Primary Examiner* — Angelica M McKinney
(74) *Attorney, Agent, or Firm* — Loza & Loza, LLP

(57) ABSTRACT

A device that includes a board, a first integrated device coupled to the board, a speaker coupled to the first integrated device, a microphone coupled to the first integrated device and a power source configured to provide power to the first integrated device, the speaker and the microphone. The device has a length of about 2.4 centimeter (cm) or less, and a diameter of about 1.2 centimeter (cm) or less. The first integrated device includes a processor. The device further includes a second integrated device configured to provide wireless communication capabilities. The device further includes a wireless charging circuit to enable wireless charging of the power source.

20 Claims, 10 Drawing Sheets

(51) Int. Cl.
*H05K 1/02* (2006.01)
*H05K 1/18* (2006.01)

(52) U.S. Cl.
CPC ........ *H04R 25/35* (2013.01); *H04R 2225/023* (2013.01); *H04R 2225/025* (2013.01); *H04R 2225/31* (2013.01); *H05K 1/028* (2013.01); *H05K 1/18* (2013.01); *H05K 2201/10083* (2013.01)

(58) Field of Classification Search
CPC .......... H04R 2225/025; H04R 2225/31; H04R 1/1025; H05K 2201/10083; A61B 2562/028
See application file for complete search history.

(56) References Cited

U.S. PATENT DOCUMENTS

| | | | |
|---|---|---|---|
| 6,456,720 B1* | 9/2002 | Brimhall | H04R 25/60 381/322 |
| 8,577,067 B2 | 11/2013 | Michel et al. | |
| 8,885,860 B2 | 11/2014 | Djalilian et al. | |
| 9,232,323 B2 | 1/2016 | Rank et al. | |
| 9,866,977 B2* | 1/2018 | Moller | H04R 25/60 |
| 10,366,828 B2* | 7/2019 | Park | H01F 38/14 |
| 2005/0147267 A1* | 7/2005 | Gudmundsen | H04R 25/652 381/328 |
| 2006/0067070 A1* | 3/2006 | Otsuki | H01L 25/165 361/816 |
| 2009/0201652 A1* | 8/2009 | Chew | H05K 1/0218 361/749 |
| 2009/0279727 A1* | 11/2009 | Brimhall | H04R 25/602 381/323 |
| 2010/0088883 A1* | 4/2010 | Kwon | H04R 25/652 29/594 |
| 2010/0158296 A1 | 6/2010 | Dumas et al. | |
| 2010/0183169 A1* | 7/2010 | Kobayashi | H05K 1/142 381/104 |
| 2012/0087526 A1 | 4/2012 | Higgins et al. | |
| 2012/0089130 A1* | 4/2012 | Gyurik | A61D 7/00 604/891.1 |
| 2012/0177234 A1* | 7/2012 | Rank | G10L 19/04 381/314 |
| 2012/0224704 A1* | 9/2012 | Splettstoeszer | H04R 25/552 381/23.1 |
| 2013/0018235 A1* | 1/2013 | Thompson | A61B 5/0002 600/302 |
| 2013/0129128 A1 | 5/2013 | Wagner et al. | |
| 2013/0148828 A1* | 6/2013 | Fort | H04R 25/30 381/312 |
| 2013/0171933 A1* | 7/2013 | Rofougaran | G06K 19/0724 455/41.1 |
| 2013/0243209 A1* | 9/2013 | Zurbruegg | H04R 25/70 381/60 |
| 2014/0153756 A1* | 6/2014 | Frerking | H04R 25/554 381/315 |
| 2015/0264475 A1* | 9/2015 | Link | H04R 25/00 381/312 |
| 2016/0050474 A1* | 2/2016 | Rye | H05K 7/08 381/152 |
| 2016/0057546 A1* | 2/2016 | Lyon | H04R 25/609 381/312 |
| 2017/0156632 A1* | 6/2017 | Swiston | A61B 5/6861 |
| 2017/0180884 A1* | 6/2017 | Ozden | H04R 25/552 |
| 2017/0188164 A1 | 6/2017 | Klostermeier | |
| 2017/0195808 A1 | 7/2017 | Higgins et al. | |
| 2018/0041852 A1* | 2/2018 | Karamuk | H04R 25/602 |
| 2018/0109881 A1* | 4/2018 | Chew | H04R 25/65 |
| 2018/0254546 A1* | 9/2018 | Shamsoddini | H01Q 7/00 |
| 2019/0290171 A1* | 9/2019 | Scherer | A61B 5/14865 |
| 2020/0112804 A1* | 4/2020 | Moses | H04R 25/65 |

FOREIGN PATENT DOCUMENTS

| | | |
|---|---|---|
| CN | 103348702 A | 10/2013 |
| CN | 103781009 A | 5/2014 |
| CN | 104067636 A | 9/2014 |
| CN | 204316710 U | 5/2015 |
| CN | 104954960 A | 9/2015 |
| CN | 105392098 A | 3/2016 |
| EP | 2393308 A1 | 12/2011 |
| EP | 2824942 A1 | 1/2015 |
| WO | 2012048232 A2 | 4/2012 |

OTHER PUBLICATIONS

Fattaruso J.W., et al., "Analog Processing Circuits for a 1.1V 270 [mu]A Mixed-Signal Hearing Aid Chip," Solid-State Circuits Conference, 2002, Digest of Technical Papers. 2002 IEEE International, Feb. 3-7, 2002, Piscataway, NJ, USA, IEEE, vol. 2, Feb. 3, 2002 (Feb. 3, 2002), pp. 310-311 & 520-521, XP010585079.

International Search Report and Written Opinion—PCT/US2017/047176—ISA/EPO—dated Nov. 14, 2017.

Kim S., et al., "Clearphone: A 0.9 V 96 [mu]W Digital Hearing Aid System," Biomedical Circuits and Systems Conference (BIOCAS), IEEE, Piscataway, NJ, USA, Nov. 29, 2006 (Nov. 29, 2006), pp. 182-185, XP031307225.

Partial International Search Report—PCT/US2017/047176—ISA/EPO—dated Sep. 22, 2017.

Taiwan Search Report—TW106127846—TIPO—dated Aug. 30, 2021.

* cited by examiner

CROSS SECTIONAL VIEW OF
UNFOLDED HEARABLE DEVICE

HEARABLE DEVICE COMPRISING INTEGRATED DEVICE AND WIRELESS FUNCTIONALITY

CLAIM OF BENEFIT

This application claims priority to and the benefit of Provisional Application No. 62/376,738 filed on Aug. 18, 2016 in the U.S. Patent and Trademark Office, the entire content of which is incorporated herein by reference.

BACKGROUND

Field of the Disclosure

Various features relate generally to a hearable device, and more specifically to a hearable device that includes an integrated device and wireless functionality.

Background

FIG. 1 illustrates a hearing aid 100 that includes a shell 102, a tube 104 and an ear piece 106. The shell 102 includes a battery 120, a microphone 122 and a speaker 124. The shell 102 encapsulates the battery 120, the microphone 122 and the speaker 124. The shell 102 is coupled to the tube 104. The tube 104 is coupled to the ear piece 106. An ear (e.g., human ear) includes an outer ear, a middle ear and an inner ear. The outer ear includes an ear canal, an auricle and a lobe. The ear piece 106 is designed to fit into the ear canal of an ear. The shell 102 and the tube 104 are positioned outside of the ear. For example, the shell 102 may be positioned behind the auricle of the outer ear.

The hearing aid 100 operates by using the microphone 122 to pick out sounds. The speaker 124 then emits the sounds through the tube 104 and to the ear piece 106. The sound coming out of the ear piece 106 then travels through the ear canal, to the middle ear and the inner ear. The battery 120 provides the power to operate the microphone 122 and the speaker 124. Once the battery 120 runs low or is out of power, the battery 120 is replaced with another battery.

There are many drawbacks to the hearing aid 100. One, the hearing aid 100 has limited functionality. Another, the design of the hearing aid 100 is such that it is fits awkwardly outside of the ear. Therefore, there is an ongoing need for better hearable devices with better form factors, and more functionalities and capabilities.

SUMMARY

Various features relate generally to a hearable device, and more specifically to a hearable device that includes an integrated device and wireless functionality.

One example provides a device that includes a board, a first integrated device coupled to the board, a speaker coupled to the first integrated device, a microphone coupled to the first integrated device and a power source configured to provide power to the first integrated device, the speaker and the microphone. The device has a length of about 2.4 centimeter (cm) or less, and a diameter of about 1.2 centimeter (cm) or less.

Another example provides an apparatus that includes a board, a first integrated device coupled to the board, means for generating a sound wave, the means for generating a sound wave coupled to the first integrated device, means for detecting a sound wave, the means for detecting a sound wave coupled to the first integrated device, and means for providing power to the first integrated device, the speaker and the microphone. The apparatus has a length of about 2.4 centimeter (cm) or less, and a diameter of about 1.2 centimeter (cm) or less.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Some features pertain a hearable device that includes a board, a first integrated device coupled to the board, a speaker coupled to the first integrated device, a microphone coupled to the first integrated device and a power source configured to provide power to the first integrated device, the speaker and the microphone. The hearable device has a length of about 2.4 centimeter (cm) or less, and a diameter of about 1.2 centimeter (cm) or less. The first integrated device includes a processor. The first integrated device may include a low power processor configured to operate with 5-2000 micro-Watts of processor power consumption. The hearable device further includes a flex board coupled to the board (e.g., printed circuit board (PCB)). The hearable device further includes another integrated device configured to provide wireless communication capabilities. The hearable device further includes a coil and a wireless charging circuit to enable wireless charging of the power source. The hearable device includes another integrated device configured to provide compression/decompression (CODEC) functionality.

Exemplary Hearable Device

Figure 1:
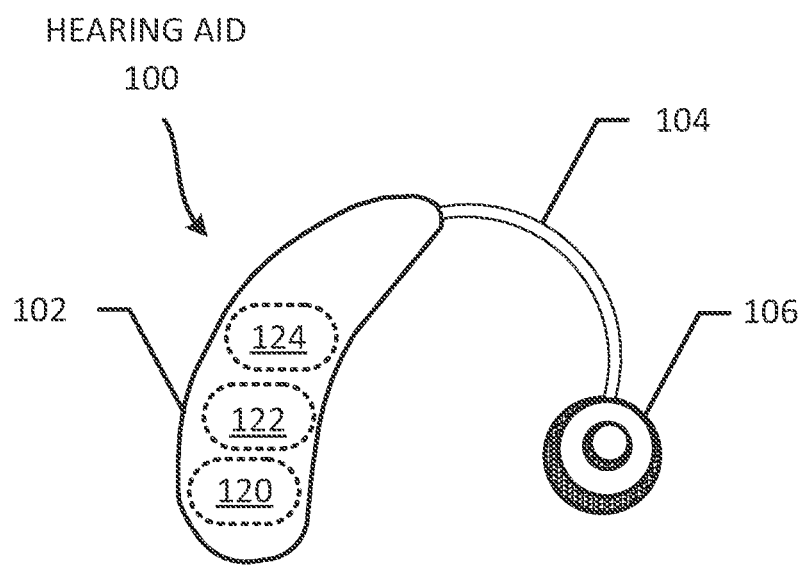
FIG. 1 illustrates a hearing aid.
Figure 2:
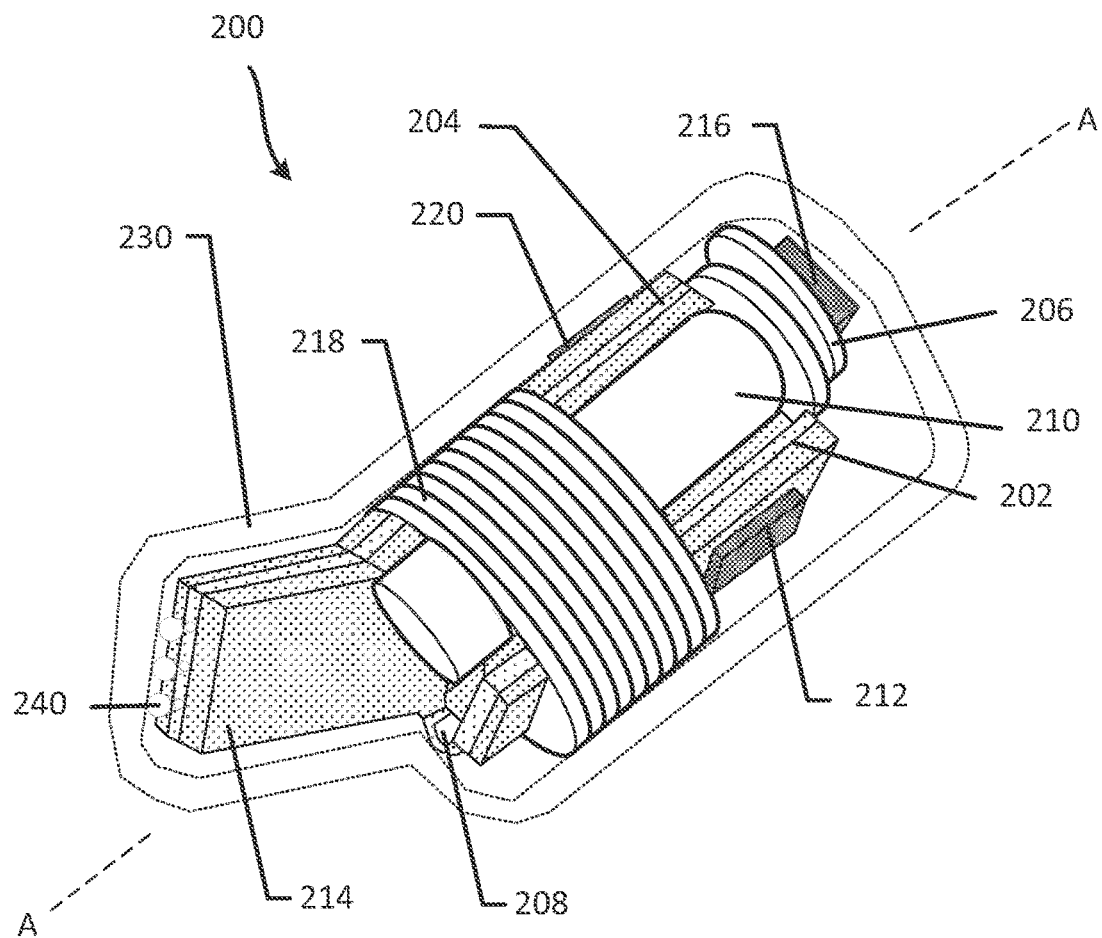
FIG. 2 illustrates an angled view of a hearable device comprising an integrated device.

FIG. 2 illustrates an example of a hearable device 200 that includes several functionalities and capabilities. The hearable device 200 includes a first board 202, a second board 204, a third board 206, a flex board 208, a power source 210, a first integrated device 212, a speaker 214, a microphone 216, a coil 218, a second integrated device 220 and an encapsulant 230. In some implementations, the hearable device 200 may have a length of about 2.4 centimeter (cm) or less, and a diameter of about 1.2 centimeter (cm) or less. In some implementations, the hearable device 200 is small enough to substantially fit in the ear canal of the outer ear. In some implementations, the hearable device 200 may be positioned in the ear such that the microphone 216 faces outwards and the speaker 214 faces the inner ear.

The flex board 208 may be a flexible printed circuit (FPC) or any flexible board. The flex board 208 is coupled to the first board 202, the second board 204 and the third board 206. The flex board 208 may include one or more flex boards. The first board 202, the second board 204 and the third board 206 may each include a printed circuit board (PCB). The power source 210 may be a means for providing power (e.g., battery) to one or more components of the hearable device 200. The first board 202 is coupled to a first portion of the flex board 208. The second board 204 is coupled to a second portion of the flex board 208. The third board 206 is coupled to a third portion of the flex board 208. A board (e.g., first board 202, flex board 208) includes one or more interconnects that are configured to provide one or more electrical paths between two or more points or components. A board may include one or more dielectric layers (e.g., polyimide layer) that at least partially encapsulate the interconnects. In some implementations, interconnects are formed between two dielectric layers of the board. A board may include a substrate (e.g., silicon substrate) that is sufficiently thin to be flexible.

As shown in FIG. 2, the flex board 208 is at least partially wrapped around the power source 210 (e.g., around a length and/or periphery of the power source 210). The first board 202 and the second board 204 are positioned along the length of the power source 210. The third board 206 is positioned over a top portion of the power source 210. The microphone 216 (e.g., means for detecting a sound wave) is coupled to the third board 206. The first integrated device 212 is coupled to the first board 202. The first integrated device 212 may include a processor (e.g., low power processor, central processing unit (CPU)). The first integrated device 212 may include a System in Package (SiP) that is configured to provide several functionalities. In some implementations, a System in Package (SiP) may be a package with multiple chips, actives and passive components packaged inside of a single package to reduce foot print by either stacking and/or reducing the spacing between components and/or tighter line and space design rules. The speaker 214 (e.g., means for generating a sound wave) may be coupled to the first board 202.

The second integrated device 220 is coupled to the second board 204. The second integrated device 220 may include a compression/decompression (CODEC) device for providing compression/decompression (CODEC) functionality (e.g., means for providing compression/decompression (CODEC) functionality). An example of CODEC functionality is audio CODEC functionality.

Although not shown in FIG. 2, the hearable device 200 may include other integrated devices that may be configured to provide different functionalities and capabilities. For example, in some implementations, the hearable device 200 may include an integrated device that is configured to provide wireless communication (e.g., means for wireless communication), such as Bluetooth wireless communication. In some implementations, the wireless communication may be implemented as a separate integrated device or as part or another integrated device in the hearable device 200. In some implementations, some or all of the functionalities of the hearable device are implemented in a single integrated device (e.g., SiP that includes several chips).

FIG. 2 illustrates the coil 218 wrapped around the power source 210, part of the flex board 208, the first board 202 and the second board 204. The coil 218 may wrap around the power source 210, part of the flex board 208, the first board 202 and the second board 204 in a solenoid pattern or spring pattern. The coil 218 may be a wireless charging coil. The coil 218 may be coupled to the power source 210 and a wireless charging circuit. The coil 218 and the wireless charging circuit are configured to enable wireless charging of the power source 210. The wireless charging circuit may be a separate integrated device or may be part of another integrated device (e.g., first integrated device 212). In some implementations, a means for wireless charging may include the coil 218 and the wireless charging circuit.

In some implementations, the flex board 208 is configured in such a way as to enable electrical paths (e.g., electrical connections) between, the power source 210, the first integrated device 212, the speaker 214, the microphone 216, the coil 218, the second integrated device 220, and/or any other components (e.g., passive device) described in the disclosure, while keeping the form factor of the hearable device 200 as small and compact as possible.

FIG. 2 illustrates the encapsulant 230 encapsulating the first board 202, the second board 204, the third board 206, the flex board 208, the power source 210, the first integrated device 212, the speaker 214, the microphone 216, the coil 218, and the second integrated device 220. Different implementations may use different materials for the encapsulant 230. The encapsulant 230 may include material that is malleable so as the encapsulant 230 can substantially take the shape of the ear canal when the hearable device 200 is positioned in the ear canal. In some implementations, the encapsulant 230 may include one or more cavities 240 near the speaker 214. In some implementations, the cavities 240 travel through the encapsulant 230 and can be configured as wave guides for the speaker 214. That is, the cavities 240 may allow sound waves generated by the speaker 214 to pass through the encapsulant 230.

Figure 3:
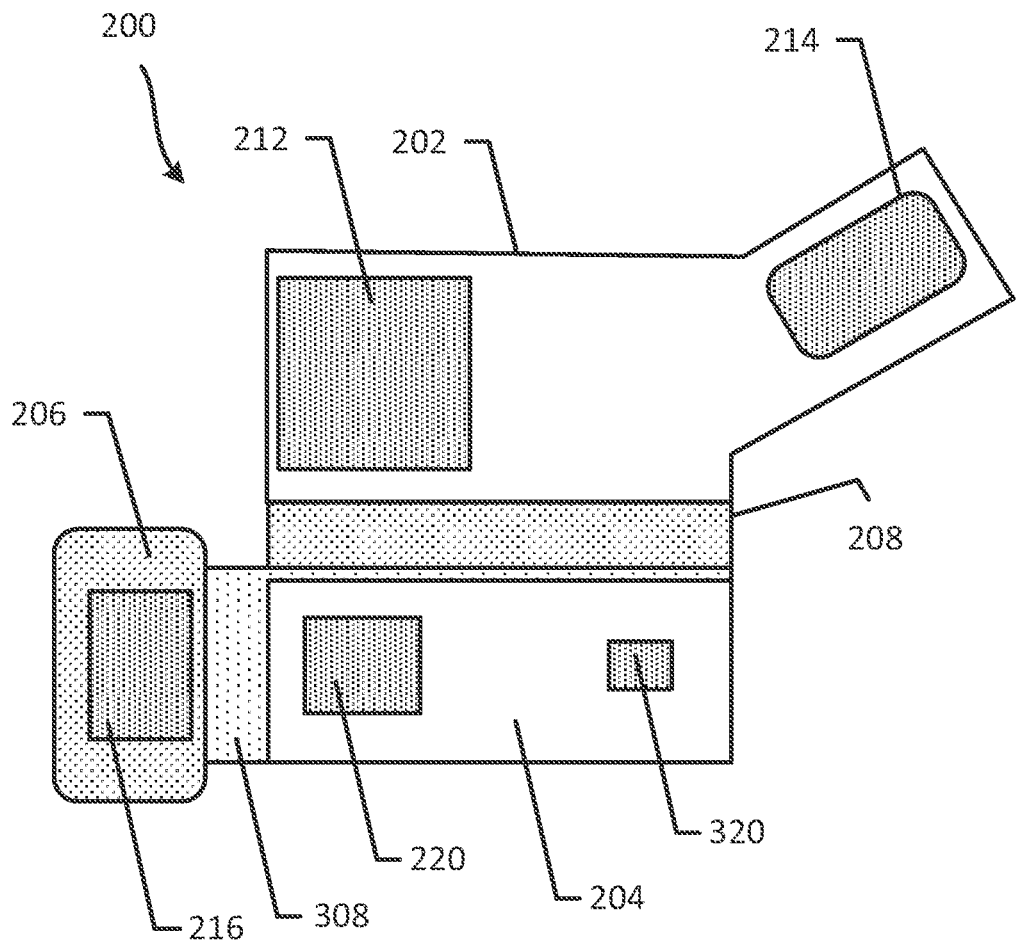
FIG. 3 illustrates a plan view of an unfolded hearable device comprising an integrated device.

FIG. 3 illustrates an exemplary view of the hearable device 200 unfolded. The view of FIG. 3 is across the line AA of FIG. 2. As shown in FIG. 3, the hearable device 200 includes the first board 202, the second board 204, the third board 206, the flex board 208, the first integrated device 212, the speaker 214, the microphone 216 and the second integrated device 220. The hearable device 200 also includes the second integrated device 220 and a third integrated device 320.

FIG. 3 illustrates that the hearable device 200 includes the flex board 208 (e.g., first flex board) and the flex board 308 (e.g., second flex board). In some implementations, the flex board 208 and the flex board 308 are the same flex board.

The second integrated device 220 and the third integrated device 320 are coupled to the second board 204. In some implementations, the second integrated device 220 is a compression/decompression (CODEC) device that is configured for providing compression/decompression (CODEC) functionality (e.g., means for providing compression/decompression (CODEC) functionality). An example of CODEC functionality is audio CODEC functionality. In some implementations, the third integrated device 320 is configured to provide power management (e.g., means for power management). An example of power management includes voltage regulation. It is noted that in some implementations, the functionalities of the second integrated device 220 and the third integrated device 320 may be implemented in a same integrated device. For example, in some implementations, the functionalities of the second integrated device 220 and the third integrated device 320 may be implemented in the first integrated device 212.

In some implementations, integrating diverse functionalities into the hearable device faces two major challenges. First, the desire to fit the device into the ear canal imposes drastic form factor (e.g., volume) constraint. The hearable device needs to be small enough to fit within the ear canal and a large fraction or percentage of the volume needs to be dedicated to the power source (e.g., battery). This requires that the volume of the electronics (chips, passives, flexible PCB, components) need to be minimized through advanced packaging techniques such as using System in Package (SiP) design that includes stacking and integrating multiple chips and components into each individual package. This reduces parasitic losses and power needed to energy long traces on printed circuit boards. An example of such an integrated device (e.g., SiP) is illustrated and described in FIG. 7 below.

Second, even though a majority of the form factor in the hearable device 200 may be dedicated to the power source 210 (e.g., battery), the size of the battery is quite small. In some implementations, the integration of various chips and their functionalities needs to be carefully selected to reduce the amount of power drawn from the power source 210 (e.g., battery) in order to provide adequate battery life. Two exemplary areas of focus for reducing power is to use ultra-low power logic processors and ultra-lower power radios. For example, in some implementations, processors based on advanced node Complementary metal-oxide-semiconductor (CMOS) such as 28 nanometer (nm) low power (LP) or 28 nm Fully Depleted Silicon on Insulator (FD-SOI) technology that enable ultra-lower power processors with 5-2000 micro-Watts of processor power consumption while supporting always-on functionality may be used in the hearable device 200 or any of the hearable devices described in the disclosure. Additionally, the availability of a low power processor (e.g., ultra-low power processor) within the hearable device 200 enables data processing and signal processing to happen locally. The eliminates the power consumption of transmitting data from the hearable device to a secondary device such as smart phone. With availability of a local ultra-low power processor most of the signal processing is done locally and only a small fraction of data is transmitted to the secondary device (e.g., phone). Furthermore data transmission is done through radios designed at similarly ultra-low power advanced node CMOS are desired to keep leakage current draw to a minimum, have low power (e.g., sub-microWatt) wake-up circuits to support useful battery life. Thus, in some implementations, the hearable device 200 may include one or more processors that draws about 5-2000 micro-Watts of power (e.g., processor power) and locally processes at least most of the audio data (e.g., audio CODEC). In some implementations, an ultra low power processor or a low power processor may be configured to use about 2 milli-Watts of power of less (5-2000 micro-Watts). In some implementations, one or more of the lower power processors described in the disclosure may operate at a clock rate or clock speed of about 30-50 megahertz (Mhz).

It is noted that different implementations may include different numbers of integrated devices coupled to the first board 202, the second board 204 and/or the third board 206. FIG. 2 and FIG. 3 are merely examples of a configuration of a hearable device. For example, the speaker 214 may be coupled to the second board 204 instead of the first board 202 in some implementations. The flex board 208 and the flex board 308 are flexible (e.g., bendable) such that the first board 202, the second board 204 and/or the third board 206 can be at least partially wrapped around the power source 210. In some implementations, at least one flex board (e.g., 208, 308) has a bend radius of 5 millimeters (mm) or less. In some implementations, at least one flex board (e.g., 208, 308) may be flexible in such a way that the flex board can bend by at least 45 degrees or more (e.g., 45 degrees to 360 degrees). In some implementations, the flex board(s) (e.g., 208, 308) allows the hearable device 200 to have a small form factor (e.g., volume) by allowing components to wrap around the power source 210 thereby saving a lot of space.

Different implementations may use components that take up different real estate or footprint. For example, an integrated device may take up about 120 square millimeters (mm). A component (e.g., surface mounted technology (SMT) component) may take up about 60-100 square millimeters (mm). As shown in FIG. 3, the first board 202 may have a size of about 48 square millimeters (mm) or less, and the second board 204 may have a size of about 40 square millimeters (mm) or less. However, different implementations may use boards (e.g., 202, 204) with different sizes. In some implementations, the hearable device 200 comprises a length of about 2.4 centimeters (cm) or less (e.g., about 1.8-2.4 centimeters), and a diameter of about 1.2 centimeters (cm) or less (e.g., about 1-1.2 centimeters) or a width and height (W×H) that is similar to about 1.2 centimeters (cm) or less (e.g., about 1-1.2 centimeters).

Different implementations of a hearable device may have different designs, configurations, and/or components. For example, different components (e.g., SMT components, passive devices) may be coupled to the boards. Below are further examples of hearable devices.

Exemplary Hearable Device

Figure 4:
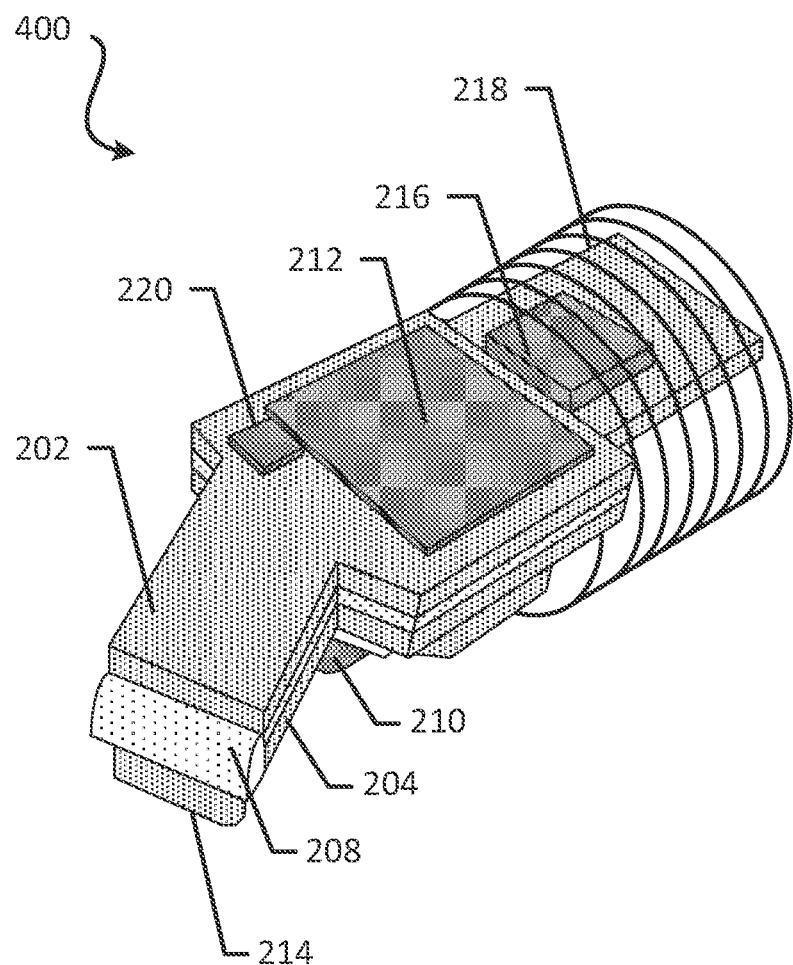
FIG. 4 illustrates an angled view of another hearable device comprising an integrated device.
Figure 5:
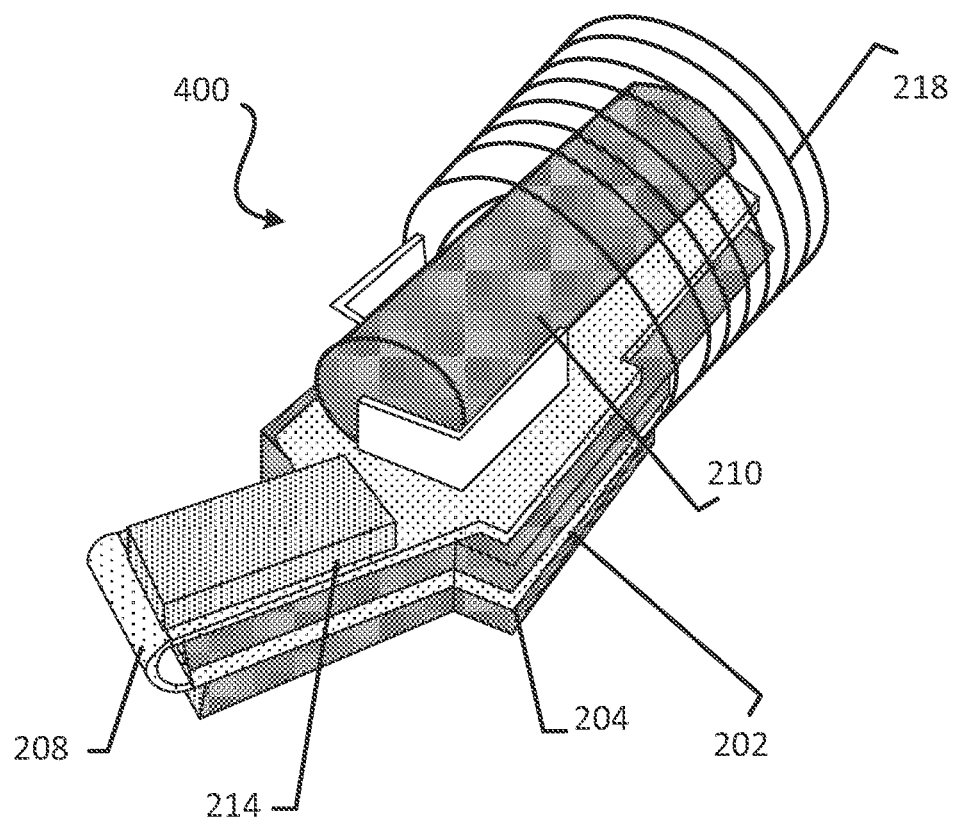
FIG. 5 illustrates another angled view of another hearable device comprising an integrated device.

FIGS. 4 and 5 illustrate views of a hearable device 400. The hearable device 400 is similar to the hearable device 200, but with a different design. The hearable device 400 may have the same or different functionalities as the hearable device 200. The hearable device 400 is shown without the encapsulant 230. However, in some implementations, the hearable device 400 may include the encapsulant 230. In some implementations, the hearable device 400 may have a length of about 2.4 centimeter (cm) or less, and a diameter of about 1.2 centimeter (cm) or less. In some implementations, the hearable device 400 is small enough to substantially fit in the ear canal of the outer ear. In some implementations, the hearable device 400 may have similar dimensions as the hearable device 200.

As shown in FIGS. 4 and 5, the hearable device 400 includes the first board 202, the second board 204, the flex board 208, the power source 210, the first integrated device 212, the speaker 214, the microphone 216, the coil 218, and the second integrated device 220.

The first board 202, the second board 204, the flex board 208, the first integrated device 212, the speaker 214, the microphone 216, the coil 218, and the second integrated device 220 are all located on one side of the power source 210. The first board 202 may be coupled to a first side of the flex board 208. The second board 204 may be coupled a second side of the flex board 208.

The first integrated device 212 and/or the second integrated device 220 may be low power consumption processors, as described in FIG. 2. Thus, in some implementations, the hearable device 400 may include one or more processors that draws about 5-2000 micro-Watts of power (e.g., processor power) and locally processes at least most of the audio data (e.g., audio CODEC). In some implementations, an ultra low power processor or a low power processor may be configured to use about 2 milli-Watts of power of less (5-2000 micro-Watts). In some implementations, one or more of the lower power processors described in the disclosure may operate at a clock rate or clock speed of about 30-50 megahertz (Mhz).

The coil 218 is formed such that the coil 218 surrounds the first board 202, the second board 204, the flex board 208 and the microphone 216.

The speaker 214, the microphone 216 and the power source 210 are coupled to the flex board 208. The flex board 208 is coupled to the first board 202 and the second board 204. The first integrated device 212 and the second integrated device 220 are coupled to the first board 202. In some implementations, the speaker 214, the microphone 216 and/or the power source 210 may be coupled to the first board 202 and/or the second board 204.

The hearable device 400 may include other components and/or devices as described for the hearable device 200. These other components and/or devices (e.g., passive device, wireless communication device, CODEC device) may be coupled to the first board 202, the second board 204 and/or the flex board 208. These and other functionalities may be implemented in a single integrated device (e.g., SiP) or two or more integrated devices. In some implementations, the hearable device 400 comprises a length of about 2.4 centimeters (cm) or less (e.g., about 1.8-2.4 centimeters), and a diameter of about 1.2 centimeters (cm) or less (e.g., about 1-1.2 centimeters) or a width and depth that is similar to about 1.2 centimeters (cm) or less (e.g., about 1-1.2 centimeters).

Exemplary Hearable Device

Figure 6:
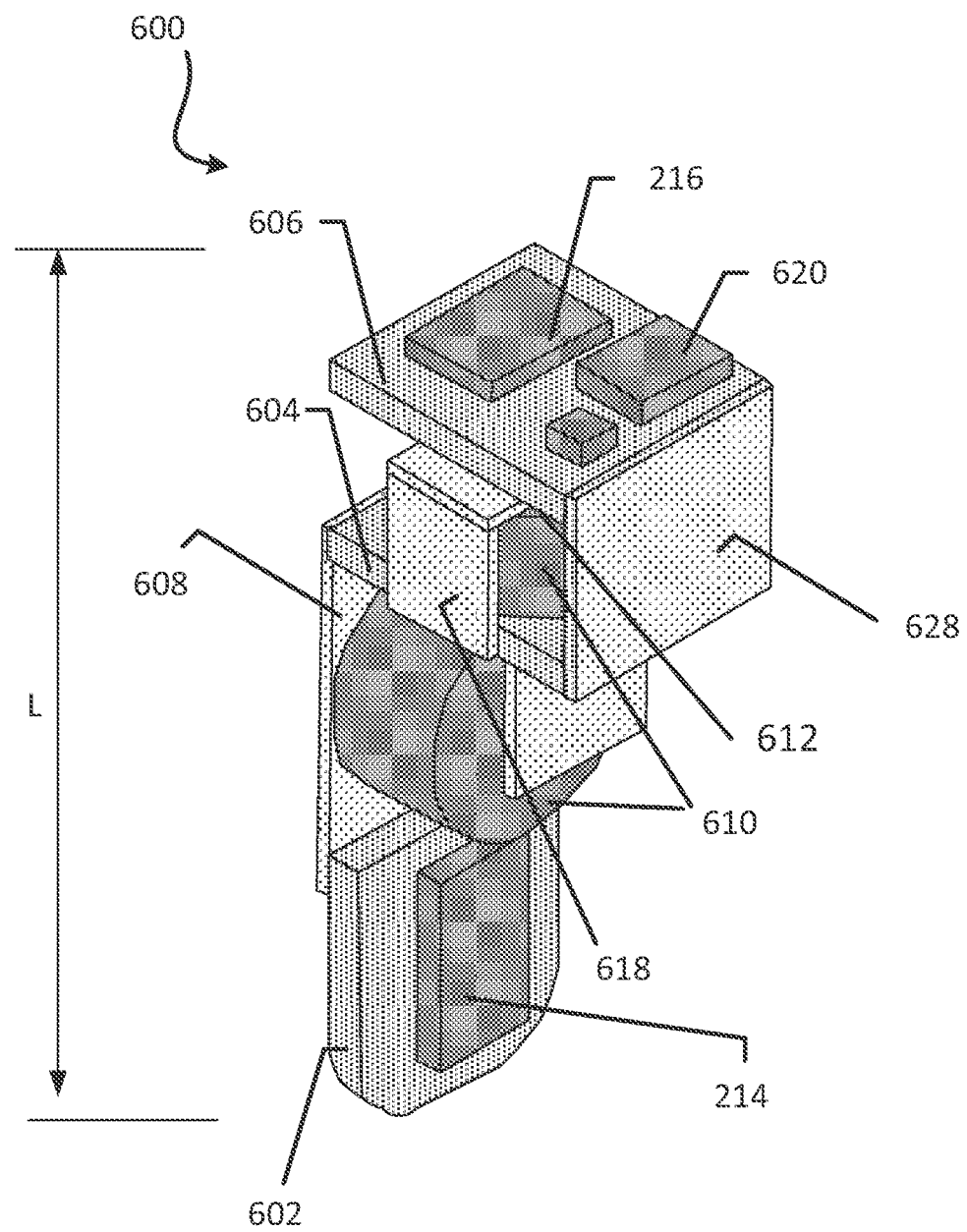
FIG. 6 illustrates a view of another hearable device comprising an integrated device.

FIG. 6 illustrates a view of a hearable device 600. The hearable device 600 is similar to the hearable device 200, but with a different design. The hearable device 600 may have the same or different functionalities as the hearable device 200. The hearable device 600 is shown without the encapsulant 230. However, in some implementations, the hearable device 600 may include the encapsulant 230. In some implementations, the hearable device 600 may have a length of about 2.4 centimeters (cm) or less (e.g., about 1.8-2.4 centimeters), and a diameter of about 1.2 centimeters (cm) or less (e.g., about 1-1.2 centimeters). In some implementations, the hearable device 600 is small enough to substantially fit in the ear canal of the outer ear.

As shown in FIG. 6, the hearable device 600 includes a first board 602, a second board 604, a third board 606, a first flex board 608, a second flex board 618, a third flex board 628, a power source 610, a first integrated device 612, a second integrated device 620, the speaker 214 and the microphone 216.

The first board 602 is coupled to the first flex board 608. The first flex board 608 is coupled to the second board 604. The second board 604 is coupled to the second flex board 618 and the third flex board 628. The second flex board 618 and the third flex board 628 are coupled to the third board 606. The flex board(s) (e.g., 608, 618, 628) are flexible (e.g., bendable) such that the board(s) (602, 604, 606) can be at least partially wrapped around the power source 610. In some implementations, at least one flex board (e.g., 608, 618, 628) has a bend radius of 5 millimeters (mm) or less. In some implementations, at least one flex board (e.g., e.g., 608, 618, 628) may be flexible in such a way that the flex board can bend by at least 45 degrees or more (e.g., 45 degrees to 360 degrees). In some implementations, the flex board(s) (e.g., 608, 618, 628) allows the hearable device 600 to have small form factor (e.g., volume) by allowing components to wrap around the power source 610 thereby saving a lot of space.

The power source 610 includes a plurality of batteries (e.g., button cell batteries). The power source 610 is coupled to the second board 604, the first flex board 608 and the second flex board 618. In some implementations, the first flex board 608 and the second flex board 618 may at least partially wrap around the power source 610.

The speaker 214 is coupled to the first board 602. The first integrated device 612 is coupled to the third board 606. The first integrated device 612 is located underneath the third board 606. However, the first integrated device 612 may be located in different locations. The first integrated device 612 may include a System in Package (SiP) that includes various functionalities. The first integrated device 612 may for example include a processor, a memory, and/or a wireless communication device (e.g., Bluetooth device)). The microphone 216 and the second integrated device 620 are coupled to the third board 606. The second integrated device 620 may include various functionalities, CODEC and/or power management. It is noted that in some implementations, the functionalities of the first integrated device 612 and the second integrated device 620 may be implemented in a same integrated device. Other components (e.g., passive device) may also be coupled to the boards.

The first integrated device 612 and/or the second integrated device 620 may be low power consumption processors, as described in FIG. 2. Thus, in some implementations, the hearable device 600 may include one or more processors that draws about 5-2000 micro-Watts of power (e.g., processor power) and locally processes at least most of the audio data (e.g., audio CODEC). In some implementations, an ultra low power processor or a low power processor may be configured to use about 2 milli-Watts of power of less (5-2000 micro-Watts). In some implementations, one or more of the lower power processors described in the disclosure may operate at a clock rate or clock speed of about 30-50 megahertz (Mhz).

As shown in FIG. 6, the first integrated device 612 is about 5 millimeters (mm)×5 millimeters (mm)×0.4 millimeters (mm), or less. The power source 610 (e.g., battery) is about 5.8 millimeters (mm)×3.6 millimeters (mm), or less. However, different implementations may use components with different dimensions. It is noted that the hearable device 600 may be modified to include other components and/or functionalities as described for the other hearable devices in the present disclosure.

Exemplary Integrated Devices

Various integrated devices (e.g., first integrated device 212, second integrated device 220, first integrated device 612, second integrated device 620) are described in the present disclosure. These integrated devices may be implemented in any of the hearable devices described in the present disclosure. These integrated devices may also include different functionalities and/or capabilities. An integrated device may include a semiconductor device, an integrated circuit, a die, an interposer, a package or package-on-package (PoP), and/or a System-in-Package (SiP).

Figure 7:
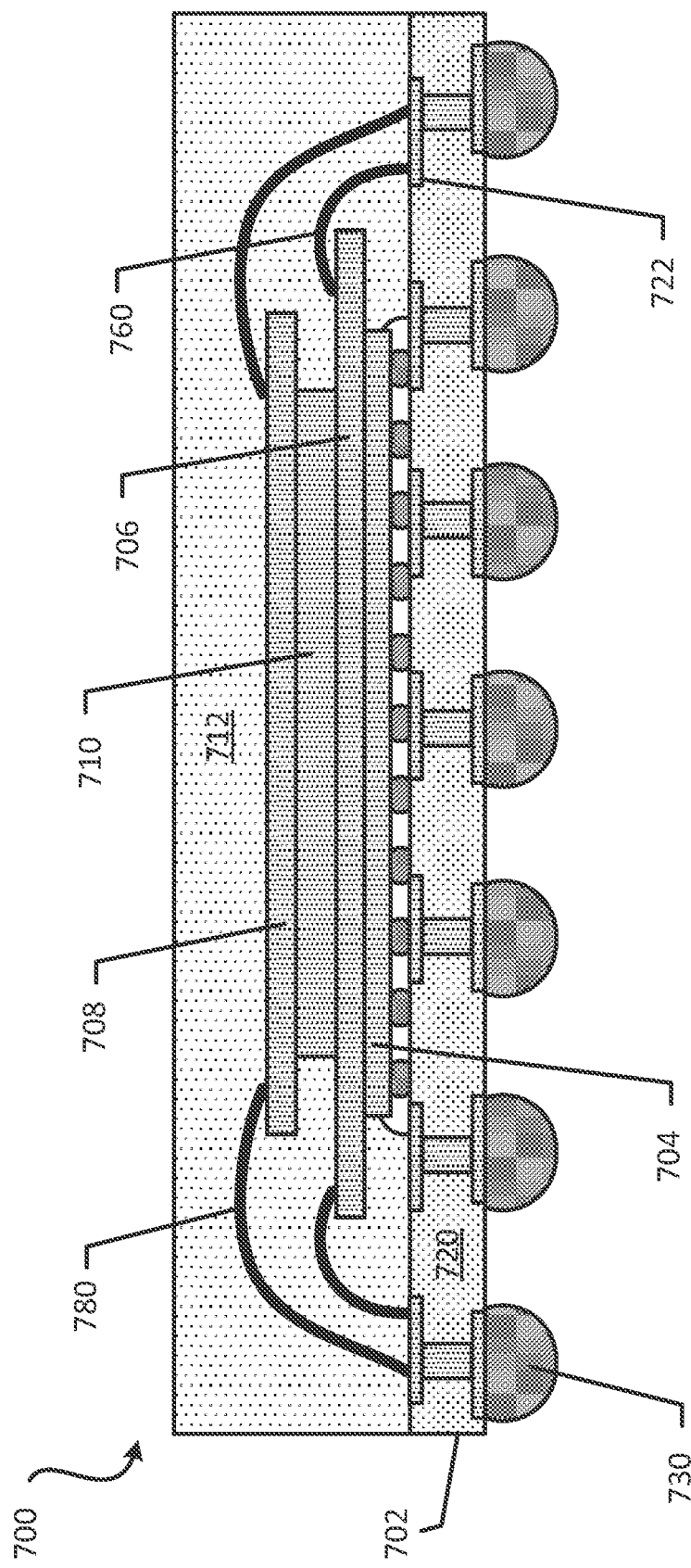
FIG. 7 illustrates a profile view of an integrated device that may be implemented in a hearable device.

FIG. 7 illustrates an example of an integrated device 700 that may be implemented in a hearable device of the present disclosure. For example, the integrated device 700 may be implemented as the first integrated device 212, the second integrated device 220, the first integrated device 612, and/or the second integrated device 620. The integrated device 700 includes a substrate 702, a first die 704, a second die 706, a third die 708, a spacer 710 and an encapsulation layer 712.

The substrate 702 includes one or more dielectric layers 720 and a plurality of interconnects 722. A plurality of solder interconnects 730 (e.g., solder balls) is coupled to the plurality of interconnects 722.

The first die 704 is coupled to the substrate 702. The second die 706 is coupled (e.g., mounted over) the first die 704. The spacer 710 is coupled to the second die 706. The third die 708 is coupled (e.g., mounted over) the spacer 710. The second die 706 is electrically coupled to the substrate 702 through a plurality of first wire bonds 760. The third die 708 is electrically coupled to the substrate 702 through a plurality of second wire bonds 780.

The encapsulation layer 712 at least partially encapsulates the first die 704, the second die 706, the third die 708 and the spacer 710. The encapsulation layer 712 may include a mold compound, an epoxy fill and/or a resin. FIG. 7 is merely an example of an integrated device. Different implementations may use integrated devices with different configurations and arrangements.

The first die 704 includes a processor. The second die 706 includes a Bluetooth communication device. The third die 708 includes a memory device. However, different implementations may have dies with different configurations and/or functionalities. For example, a die may include a wireless charging functionality, near field communication (NFC) functionality and/or a CODEC functionality.

In some implementations, the integrated device 700 has dimensions of about 5 millimeters (mm)×5 millimeters (mm)×0.4 millimeters (mm), or less. In some implementations, the integrated device 700 is configured to use ultra-low power logic processors and ultra-lower power radios. For example, in some implementations, processors based on advanced node CMOS such as 28 nm LP or 28 nm FD-SOI technology that enable ultra-lower power processors with 5-2000 micro-Watts of processor power consumption while supporting always-on functionality may be used for the integrated device 700. An example of a transistor for an low power processor is illustrated an described below in FIG. 8.

Additionally, the availability of a ultra-low power processor within the hearable device enables data processing and signal processing to happen locally. The eliminates the power consumption of transmitting data from the hearable device to a secondary device such as smart phone. With availability of a local ultra-low power processor most of the signal processing is done locally and only a small fraction of data is transmitted to the secondary device (e.g., phone). Furthermore data transmission is done through radios designed at similarly ultra-low power advanced node CMOS are desired to keep leakage current draw to a minimum, have low power (sub-microWatt) wake-up circuits to support useful battery life. Thus, in some implementations, the second integrated device 220 may include one or more processors that draws about 5-2000 micro-Watts of power (e.g., processor power) and locally processes at least most of the audio data (e.g., audio CODEC). In some implementations, an ultra low power processor or a low power processor may be configured to use about 2 milli-Watts of power of less (e.g., 5-2000 micro-Watts).

Figure 8:
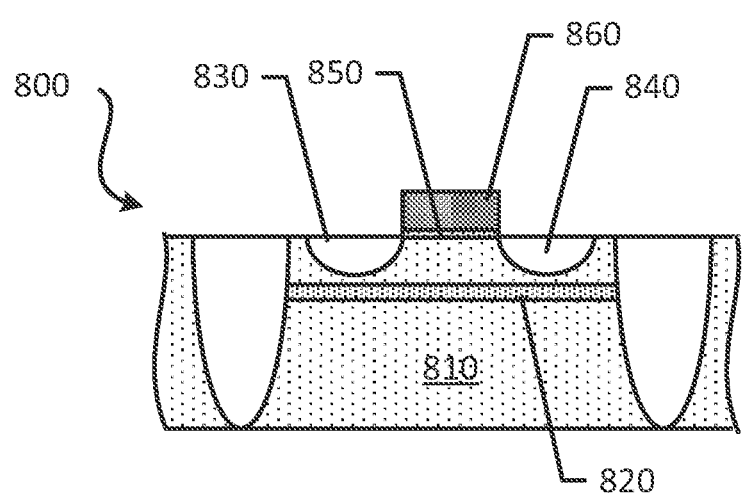
FIG. 8 illustrates a profile view of a transistor that may be implemented in an low power consumption integrated device.

FIG. 8 illustrates a profile view of a transistor 800 that may be implemented in a low power processor. For example, the transistor 800 may be implemented in the integrated device 700 of FIG. 7 and/or any other integrated devices described in the disclosure. The transistor 800 is an example of a transistor that uses a Fully Depleted Silicon on Insulator (FD-SOI) process.

As shown in FIG. 8, the transistor 800 includes a substrate 810, an oxide layer 820, a source 830, a drain 840, a silicon layer 850, and a gate 860. The source 830 and the drain 840 is formed in the substrate 810. In some implementations, the oxide layer 820 is a buried oxide in the substrate 810. The substrate 810 may be a silicon. The silicon layer 850 may be a thin film silicon layer formed over the substrate 810. The gate 860 is formed over the silicon layer 850.

In some implementations, the transistor 800 enables a low power processor that uses about 5-2000 micro-Watts of processor power consumption while supporting always-on functionality. In some implementations, such a low power processor may operate at a clock rate or clock speed of about 30-50 megahertz (MHz).

Exemplary Hearable Device

Figure 9:
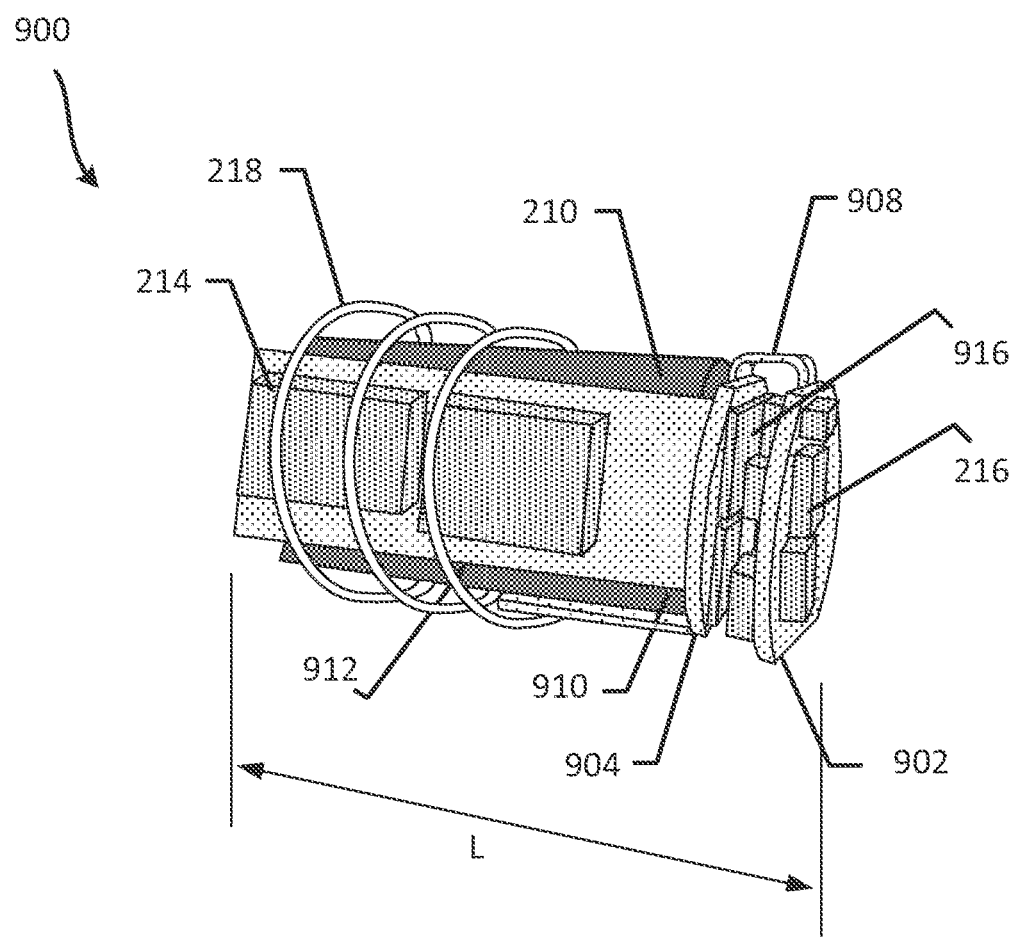
FIG. 9 illustrates a view of another hearable device comprising an integrated device.
Figure 10:
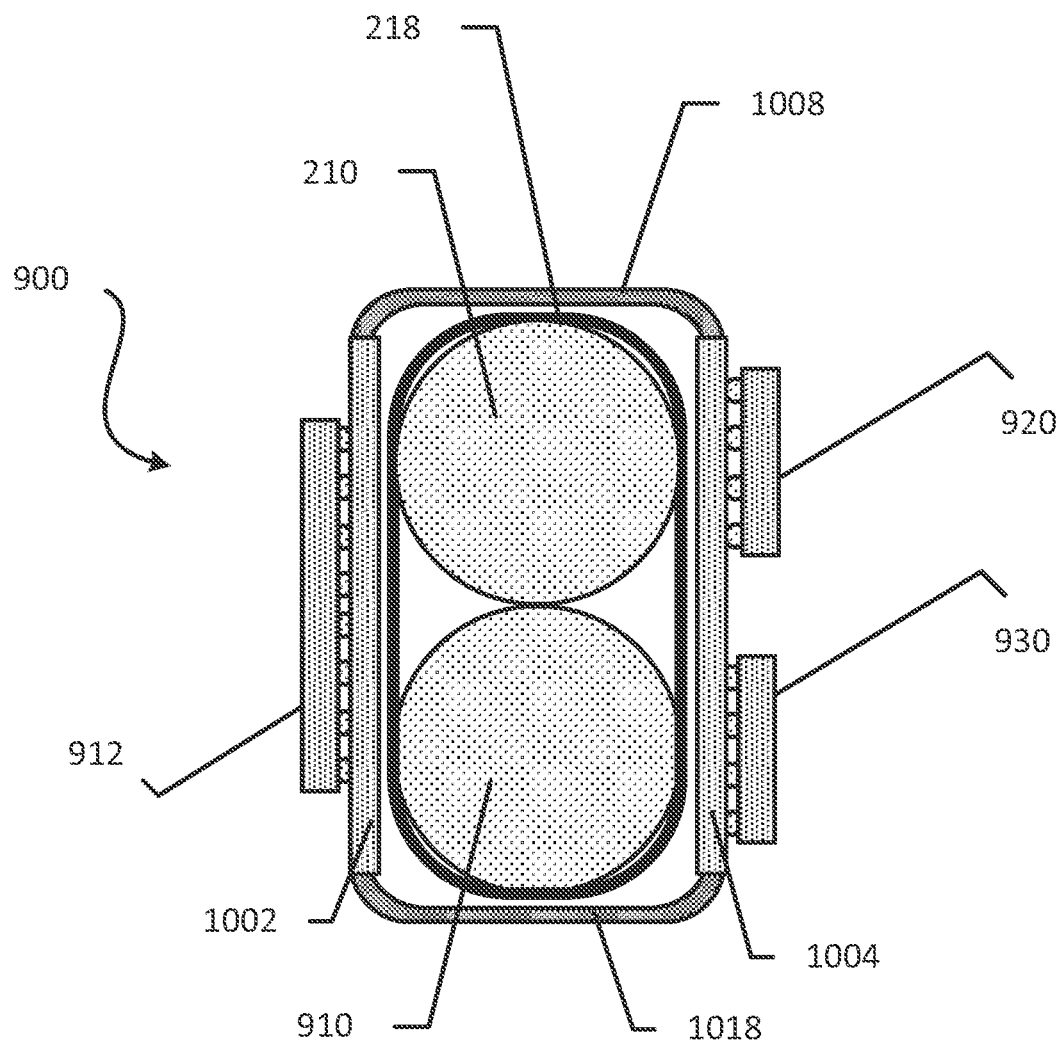
FIG. 10 illustrates a cross sectional view of another hearable device comprising an integrated device.

FIGS. 9 and 10 illustrate views of a hearable device 900. The hearable device 900 is similar to the hearable device 200, but with a different design. The hearable device 900 may have the same or different functionalities as the hearable device 200. The hearable device 900 is shown without the encapsulant 230. However, in some implementations, the hearable device 900 may include the encapsulant 230. In some implementations, the hearable device 900 may have a length of about 2.4 centimeters (cm) or less (e.g., about 1.6-2.0 cm), and a diameter of about 1.2 centimeters (cm) or less (e.g., about 1-1.2 cm). However, different implementations may have different dimensions. In some implementations, the hearable device 900 is small enough to substantially fit in the ear canal of the outer ear.

The hearable device 900 includes a first board 902, a second board 904, a third board 1002, a fourth board 1004, the power source 210, a power source 910, a first flex board 908, a second flex board 1008, a third flex board 1018, a first integrated device 912, a second integrated device 920, a third integrated device 930, one or more components 916 (e.g., surface mounted technology component), the speaker 214, the microphone 216 and the coil 218.

The first board 902 is coupled to the second board 904 through the first flex board 908. The microphone 216 is coupled to the first board 902. The one or more components 916 (e.g., passive device) are coupled to the second board 904.

The third board 1002 is coupled to the fourth board 1004 through the second flex board 1008 and the third flex board 1018. The third board 1002, the fourth board 1004, the second flex board 1008 and the third flex board 1018 at least partially surround the power source 210 and the power source 910.

The flex board(s) (e.g., 1008, 1018, 1028) are flexible (e.g., bendable) such that the board(s) (e.g., 1002, 1004, 1006) can be at least partially wrapped around the power source 610. In some implementations, at least one flex board (e.g., 1008, 1018, 1028) has a bend radius of 5 millimeters (mm) or less. In some implementations, at least one flex board (e.g., 1008, 1018, 1028) may be flexible in such a way that the flex board can bend by at least 45 degrees or more (e.g., 45 degrees to 360 degrees). In some implementations, the flex board(s) (e.g., 1008, 1018, 1028) allows the hearable device 900 to have a small form factor (e.g., volume) by allowing components to wrap around the power source(s) (e.g., 210, 910) thereby saving a lot of space.

The power source 210 and the power source 910 are configured to provide power to the first integrated device 912, the second integrated device 920, the third integrated device 930, the speaker 214 and the microphone 216.

The speaker 214 and the first integrated device 912 are coupled to the third board 1002. The second integrated device 920 and the third integrated device 930 are coupled to the fourth board 1004.

The coil 218 at least partially encapsulates the power source 210, the power source 910, the third board 1002, the fourth board 1004, the speaker 214 and/or the first integrated device 912.

Different implementations may configure the integrated devices to perform different functions. In some implementations, the first integrated device 912 is configured to operate as a processor. In some implementations, the second integrated device 920 is configured to operate as a wireless communication device (e.g., Bluetooth communication device). In some implementations, the third integrated device 1030 is configured to operate as a memory device (e.g., flash memory).

It is noted that in some implementations, the functionalities of the first integrated device 912, the second integrated device 920 and/or the third integrated device 930 may be implemented in a same integrated device. The first integrated device 912, the second integrated device 920 and/or the third integrated device 930 may be low power consumption processors, as described in FIG. 2. Thus, in some implementations, the hearable device 900 may include one or more processors that draws about 5-2000 micro-Watts of power (e.g., processor power) and locally processes at least most of the audio data (e.g., audio CODEC). In some implementations, an ultra low power processor or a low power processor may be configured to use about 2 milli-Watts of power of less (5-2000 micro-Watts). In some implementations, one or more of the lower power processors described in the disclosure may operate at a clock rate or clock speed of about 30-50 megahertz (Mhz).

It is noted that the hearable device 900 may be modified to include other components and/or functionalities as described for the other hearable devices in the present disclosure.

It is noted that the various devices, components (e.g., SMT components, passive devices) and/or the integrated devices may be coupled to the board(s) (e.g., first board 202, flex board 208) differently. In some implementations, the devices, components, and/or the integrated devices may be coupled to the board(s) through a plurality of solder interconnects (e.g., solder balls, copper pillars and solder).

One or more of the components, processes, features, and/or functions illustrated in FIGS. 2-10 may be rearranged and/or combined into a single component, process, feature or function or embodied in several components, processes, or functions. Additional elements, components, processes, and/or functions may also be added without departing from the disclosure. It should also be noted FIGS. 2-10 and its corresponding description in the present disclosure is not limited to dies and/or ICs. In some implementations, FIGS. 2-10 and its corresponding description may be used to manufacture, create, provide, and/or produce devices and/or integrated devices. In some implementations, a device may include a hearable device, a die, an integrated device, a die package, an integrated circuit (IC), a device package, an integrated circuit (IC) package, a wafer, a semiconductor device, a package-on-package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
    a first printed circuit board (PCB), a second printed circuit board (PCB), and a third printed circuit board (PCB);
    a first integrated device coupled to the first PCB, wherein the first integrated device comprises a footprint of 120 square millimeters (mm) or less;
    a speaker coupled to the first integrated device;
    a microphone coupled to the first integrated device;
    a power source configured to provide power to the first integrated device, the speaker and the microphone, wherein the first PCB and the second PCB are positioned along a length of the power source and the third PCB is positioned over a top of the power source; and
    a flex board coupled to the first PCB, the flex board at least partially wrapped around the power source;
    wherein the device has a length of about 2.4 centimeter (cm) or less, and a diameter of about 1.2 centimeter (cm) or less,
    wherein the first PCB is coupled to a first portion of the flex board, the second PCB is coupled to a second portion of the flex board, and the third PCB is coupled to a third portion of the flex board.

2. The device of claim 1, wherein the first integrated device includes a low power processor that is configured to use about 5-2000 micro-Watts of power.

3. The device of claim 1, further comprising a second integrated device configured to provide wireless communication.

4. The device of claim 1, further comprising a second integrated device configured to provide compression/decompression (CODEC) functionality.

5. The device of claim 1, further comprising:
    a wireless charging coil; and
    a wireless charging circuit coupled to the wireless charging coil,
    wherein the wireless charging coil and the wireless charging circuit are configured to enable wireless charging of the power source.

6. The device of claim 1, further comprising a memory device.

7. The device of claim 1, wherein each of the first PCB, the second PCB, and the third PCB is a rigid printed circuit board.

8. The device of claim 1, further comprising a second integrated device configured to provide power management functionality.

9. The device of claim 1, further comprising a second integrated device configured to provide magnetic near field communication (NFC).

10. A device comprising:
a first printed circuit board (PCB), a second printed circuit board (PCB), and a third printed circuit board (PCB);
a first integrated device coupled to the first PCB, wherein the first integrated device comprises a footprint of 120 square millimeters (mm) or less;
a speaker coupled to the first integrated device;
a microphone coupled to the first integrated device;
a second integrated device configured to provide wireless communication;
a third integrated device configured to provide compression/decompression (CODEC) functionality, the second integrated device and the third integrated device coupled to the second PCB;
a power source configured to provide power to the first integrated device, the second integrated device, the third integrated device, the speaker and the microphone, wherein the first PCB and the second PCB are positioned along a length of the power source and the third PCB is positioned over a top of the power source; and
a flex board coupled to the first PCB and the second PCB, the flex board at least partially wrapped around the power source;
wherein the device has a length of about 2.4 centimeter (cm) or less, and a diameter of about 1.2 centimeter (cm) or less,
wherein the first PCB is coupled to a first portion of the flex board, the second PCB is coupled to a second portion of the flex board, and the third PCB is coupled to a third portion of the flex board.

11. An apparatus comprising:
a first printed circuit board (PCB), a second printed circuit board (PCB), and a third printed circuit board (PCB);
a first integrated device coupled to the first PCB, wherein the first integrated device comprises a footprint of 120 square millimeters (mm) or less;
means for generating a sound wave, the means for generating the sound wave coupled to the first integrated device;
means for detecting a sound wave, the means for detecting the sound wave coupled to the first integrated device;
means for providing power to the first integrated device, the means for generating the sound wave and the means for detecting the sound wave, wherein the first PCB and the second PCB are positioned along a length of the power source and the third PCB is positioned over a top of the means for providing power; and
a flex board coupled to the first PCB, the flex board at least partially wrapped around the means for providing power;
wherein the apparatus has a length of about 2.4 centimeter (cm) or less, and a diameter of about 1.2 centimeter (cm) or less,
wherein the first PCB is coupled to a first portion of the flex board, the second PCB is coupled to a second portion of the flex board, and the third PCB is coupled to a third portion of the flex board.

12. The apparatus of claim 11,
wherein the first integrated device includes a low power processor that is configured to use about 5-2000 micro-Watts of power,
wherein the first integrated device includes dimensions of 5 millimeters (mm)×5 millimeters (mm)×0.4 millimeters (mm), or less.

13. The apparatus of claim 11, further comprising means for providing wireless communication.

14. The apparatus of claim 13, wherein the means for providing wireless communication includes an integrated device that is configured to provide Bluetooth wireless communication.

15. The apparatus of claim 11, further comprising means for providing compression/decompression (CODEC) functionality.

16. The apparatus of claim 11, further comprising means for wireless charging of the power source.

17. The apparatus of claim 11, further comprising means for storing data.

18. The apparatus of claim 11, wherein the first PCB is a rigid printed circuit board.

19. The apparatus of claim 11, further comprising means for providing power management functionality.

20. The apparatus of claim 11, further comprising means for providing magnetic near field communication (NFC).

* * * * *